(12) United States Patent
Chen et al.

(10) Patent No.: US 9,330,907 B2
(45) Date of Patent: May 3, 2016

(54) MATERIAL QUALITY, SUSPENDED MATERIAL STRUCTURES ON LATTICE-MISMATCHED SUBSTRATES

(71) Applicant: The Board of Trustees of the Leland Stanford Junior University, Palo Alto, CA (US)

(72) Inventors: Robert Chen, Mountain View, CA (US); James S. Harris, Jr., Stanford, CA (US); Suyog Gupta, White Plains, NY (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 14/512,158

(22) Filed: Oct. 10, 2014

(65) Prior Publication Data

US 2015/0102465 A1    Apr. 16, 2015

Related U.S. Application Data

(60) Provisional application No. 61/889,379, filed on Oct. 10, 2013.

(51) Int. Cl.
*H01L 21/02* (2006.01)
*H01L 21/00* (2006.01)
(Continued)

(52) U.S. Cl.
CPC ...... *H01L 21/02535* (2013.01); *B81C 1/00111* (2013.01); *B81C 1/00571* (2013.01); *B82Y 10/00* (2013.01); *B82Y 40/00* (2013.01); *H01L 21/0262* (2013.01); *H01L 21/02532* (2013.01); *H01L 21/3065* (2013.01); *H01L 29/0665* (2013.01); *H01L 29/161* (2013.01);
(Continued)

(58) Field of Classification Search
CPC ... H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
USPC ............ 438/8–9, 40, 43, 443–444, 494, 498, 438/504, 634, 673, 689, 695, 697, 704–706, 438/708–709, 712–714, 733–735, 438/738–740; 257/E21.218, E21.219, 257/E21.22, E21.221, E21.222, E21.223, 257/E21.245, E21.246, E21.249, E21.25, 257/E21.252, E21.254, E21.256, E21.305, 257/E21.31, E21.332
See application file for complete search history.

(56) References Cited

U.S. PATENT DOCUMENTS

| | | |
|---|---|---|
| 5,343,490 A | 8/1994 | McCall |
| 5,548,128 A | 8/1996 | Soref et al. |

(Continued)

OTHER PUBLICATIONS

Chen et al., "Demonstration of a Ge/GeSn/Ge quantum-well microdisk resonator on silicon: enabling high-quality Ge(Sn) materials for micro- and nanophotonics", Dec. 3, 2013, pp. 37-43, Nano Letters v14.

(Continued)

*Primary Examiner* — Robert Bachner
*Assistant Examiner* — Moin Rahman
(74) *Attorney, Agent, or Firm* — Lumen Patent Firm

(57) ABSTRACT

Suspended structures are provided using selective etch technology. Such structures can be protected on all sides when the selective undercut etch is performed, thereby providing excellent control of feature geometry combined with superior material quality.

4 Claims, 8 Drawing Sheets

(51) Int. Cl.

| | | |
|---|---|---|
| *H01L 29/161* | (2006.01) | |
| *B82Y 10/00* | (2011.01) | |
| *B82Y 40/00* | (2011.01) | |
| *H01L 29/06* | (2006.01) | |
| *H01S 5/34* | (2006.01) | |
| *H01L 21/3065* | (2006.01) | |
| *B81C 1/00* | (2006.01) | |
| *H01S 5/10* | (2006.01) | |

(52) U.S. Cl.
CPC ......... *H01S5/3427* (2013.01); *B81C 2201/014* (2013.01); *H01L 21/0245* (2013.01); *H01L 21/02381* (2013.01); *H01L 21/02452* (2013.01); *H01L 21/02507* (2013.01); *H01L 29/0676* (2013.01); *H01S 5/1075* (2013.01)

(56) References Cited

U.S. PATENT DOCUMENTS

| | | | |
|---|---|---|---|
| 6,521,041 B2 | 2/2003 | Wu et al. | |
| 7,915,104 B1 | 3/2011 | Kouvetakis et al. | |
| 7,951,299 B2 | 5/2011 | Hossein-Zadeh et al. | |
| 8,647,439 B2 | 2/2014 | Sanchez et al. | |
| 2004/0037341 A1 | 2/2004 | Tan et al. | |
| 2005/0117844 A1* | 6/2005 | Abeles | B82Y 20/00 385/39 |
| 2005/0226564 A1 | 10/2005 | Gardner et al. | |
| 2012/0318334 A1* | 12/2012 | Bedell | H01L 31/076 136/255 |
| 2013/0256838 A1 | 10/2013 | Sanchez et al. | |
| 2013/0313579 A1* | 11/2013 | Kouvetakis | H01L 31/028 257/80 |
| 2014/0024204 A1 | 1/2014 | Hikavyy et al. | |
| 2014/0053894 A1* | 2/2014 | Roucka et al. | 136/255 |

OTHER PUBLICATIONS

Gupta et al., "Highly selective dry etching of germanium over germanium-tin: a novel route for GeSn nanostructure fabrication", Jul. 8, 2013, pp. 3783-3790, Nano Letters v13.

Aharonovich et al., "Low threshold room-temperature microdisk lasers in the blue spectral range", Aug. 31, 2012, arXiv:1208.6452.

* cited by examiner

MATERIAL QUALITY, SUSPENDED MATERIAL STRUCTURES ON LATTICE-MISMATCHED SUBSTRATES

CROSS REFERENCE TO RELATED APPLICATIONS

This application claims the benefit of U.S. provisional patent application 61/889,379, filed on Oct. 10, 2013, and hereby incorporated by reference in its entirety.

FIELD OF THE INVENTION

This invention relates to fabrication of semiconductor structures.

BACKGROUND

Epitaxial growth of material on a lattice-mismatched substrate typically results in a large number of defects due to misfit dislocations and threading dislocations that can greatly reduce performance. Typically, one can reduce the number of defects through continued growth and thermal annealing, thereby forming a buffer layer on which a desired structure of high material quality is grown on. However, several applications require the removal of the defective regions of the buffer layer while protecting the desired structure, even if the buffer material and the structure are composed of the same or similar materials. Existing methods for removal of the buffer layer tend to undesirably damage the desired structure, so it would be an advance in the art to provide suitably improved fabrication methods.

SUMMARY

One embodiment of the invention is a semiconductor device including a silicon substrate, and one or more Ge, SnGe, or SiSnGe device layers, where at least part of the device layers is suspended above the silicon substrate. An etch stop layer having a composition of $Sn_yGe_{1-y}$ or $Si_xSn_yGe_{1-x-y}$ with $0.05 < y \leq 1$ is present, where the etch stop layer is disposed on a bottom surface or interface of the device layers facing the silicon substrate.

The device layers can be configured as a disk supported by a post. In this case, a peripheral region of the disk is suspended. Alternatively, the device layers can be configured as a bridge supported by two posts. In this case, a region of the bridge between the two posts is suspended.

The etch stop layer can be sandwiched between two regions, and it can also be pseudomorphic with respect to the two regions. An etch stop layer sandwiched between two regions is pseudomorphic with respect to these regions if: 1) the unstrained lattice constant of the etch stop layer differs from the lattice constant of the regions, and 2) the etch stop layer is sufficiently thin that its in-plane lattice constant adjusts to match the lattice constant of the adjacent regions without creating defects or dislocations. If either or both regions includes multiple layers and/or compositional grading, then the relevant lattice constant for the region is the lattice constant at the interface with the etch stop layer. For example, the two regions can be Ge, and the etch stop layer can be GeSn.

In practice, the space between the silicon substrate and the suspended part of the device layers can be provided by performing a selective etch of a buffer region that is initially disposed between the silicon substrate and the etch stop layer. Here the selective etch does not etch the etch stop layer. The etch stop layer thus serves to protect the device layers from the selective etch. Buffers having uniform or graded composition can be employed. For example, the buffer region can have a uniform composition $Si_zGe_{1-z}$ with $z < 1$. Alternatively, the buffer region can have a graded SiGe composition. In general, the buffer region is preferably configured to alleviate a lattice mismatch between the silicon substrate and the device layers.

Another embodiment of the invention is a method for selectively etching a semiconductor structure, where the method includes providing a first region having a GeSn composition, providing a second region having a Ge composition, and selectively etching the second region while not etching the first region by exposing both regions to a fluorine-based isotropic dry etch. We have found that this etch provides an extraordinarily high level of selectivity between the first and second regions compared to conventional selective etch technology. The first region can include $Ge_{0.92}Sn_{0.08}$. The fluorine-based isotropic dry etch can use $CF_4$ as an etchant.

A further embodiment of the invention is a method of forming a suspended semiconductor structure. This method includes providing a silicon substrate, depositing a partially relaxed Ge buffer on the silicon substrate for better lattice matching to a suspended structure, depositing a GeSn etch stop layer on the buffer, depositing one or more device layers having a composition of Ge, SnGe, or SiSnGe on the etch stop layer, and selectively etching the buffer while not etching the etch stop layer by exposure to a fluorine-based isotropic dry etch. The resulting structure has the device layers at least partially suspended.

Features can be formed in the device layers. Such features can have their top and side surfaces protected (e.g., by an oxide or nitride protective layer) prior to selectively etching the buffer. This approach can provide 3-D protection of the features during exposure to the fluorine-based isotropic dry etch.

DETAILED DESCRIPTION

Figure 1:
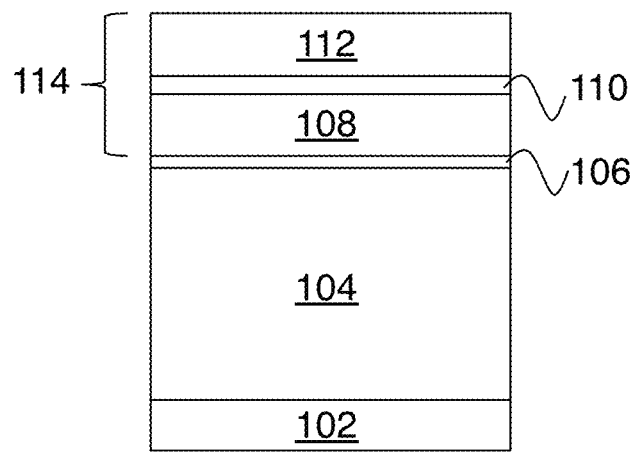
FIG. 1 shows an epitaxial stack for an experimental sample relating to an embodiment of the invention.

In part A of this section, general principles relating to embodiments of the invention are described. In part B of this section, several experimental examples are described.

A) General Principles

The main purpose of this work is the simultaneous achievement of improved material quality and suspension of micro- and nanostructures on lattice-mismatched substrates.

The present approach provides a method for removal of the defective buffer layer while creating a suspended structure by defining an etch-stop layer between the buffer layer and the desired structure.

The process for forming high material quality, suspended structures on lattice-mismatched substrates includes the use of a thick sacrificial buffer layer to improve material quality, an etch-stop layer to define the bottom of a suspended structure, and a conformal top and sidewall protective layer. The method described here is particularly useful for structures that have similar materials in both the buffer layer and suspended structure.

The epitaxial stack to leverage this technology can be defined as follows (from bottom up). First, a buffer layer (presumably with a lattice constant similar to the structure but not the substrate) is grown on the lattice-mismatched substrate. Initially, the buffer is expected to be highly defective due to misfit and threading dislocations during strain relaxation. However, continued growth and annealing can improve the buffer quality near the surface, as has been shown in the InGaAs/GaAs substrate, InAlAs/GaAs substrate, and the Ge/Si substrate material systems. Those who are skilled in the art of these material systems know the conditions used to improve material quality after relaxation. Once the surface is of desired quality in terms of defects and smoothness, an etch-stop layer is deposited. Subsequently, the desired structure to be suspended is then grown on top of the etch-stop layer. The dimension of the structure in the growth (vertical) direction is determined by the epitaxial thickness.

To structurally define the other two (lateral) dimensions in the suspended structure, various micro-/nano-fabrication techniques can be used. For example, a dry or wet etch can be used. In the case of an anisotropic etch, the chemistry used should sufficiently etch the structure (to allow for structural definition) and the etch-stop layer (to expose the sacrificial buffer). In the case of germanium-based materials where the buffer to be etched and the structure have similar germanium content and will both be etched by the undercut or release etch used for the sacrificial buffer, a conformal protective layer can be deposited to protect the sidewalls of the structure. The sidewall protector will deposit on the top and sides of the structure, but will also be deposited on the top buffer. The protective layer on the buffer can be etched away through an anisotropic etch in the vertical direction. This will also etch the protective layer on the top of the structure which needs additional protection either by having the top layer as an etch-stop layer to the undercut etch or by leaving the masking material that was used for initial patterning of the non-growth-direction dimensions. Presumably, one could use the protective layer material as the initial masking material. Once completed, the structure is protected on the top and sidewalls by the protective layer and on the bottom by an etch-stop layer with an exposed buffer. The buffer can then be etched away using an isotropic selective etch that etches the buffer material but does not etch the protective layer or etch-stop layer. The result is a suspended structure with complete removal of the sacrificial and defective buffer layer.

In general, this process can be achieved for an arbitrary material system for any purpose (other than just defect reduction) as long as the following components exist:
1) An isotropic selective etch that will etch the buffer layer but not etch: the etch-stop layer OR sidewall protective layer OR top layer of the structure (either an intrinsic structure layer or a protective layer deposited during micro-/nano-fabrication patterning).
2) An anisotropic etch that will etch the structure layer and etch-stop layer, and
3) An anisotropic etch that will etch the protective layer.

One main application in germanium-based photonics is the ability to create high-quality germanium-based micro-/nano-photonic structures on silicon. One can create germanium-based microdisk resonators, photonic crystals, or other suspended nanomembranes for electronic or sensing applications. Furthermore, resonators can be used for lasers and quantum electrodynamics with a whole new class of materials. The selective fluorine dry etch of Ge vs. GeSn described herein enabled component #1 in the previous section (components #2 and #3 already exist) for this particular material system. The technology simultaneously solves two issues in this material system, which are enabling the use of a thick germanium buffer to improve the quality of a photonic structure layer on top and allowing for precise definition of the suspended photonic structure layer in three dimensions with an etch-stop and sidewall protection layer. In particular, we used this to develop germanium-based microdisk resonators (a disk of germanium-based material suspended by a central post of germanium on silicon), as described in detail in section B. One could also use this to make other types of membrane structures, such as germanium-based photonic crystals on germanium/silicon or even suspended nanomembranes with arbitrary structure for electronic or sensing applications. For optics, photonic crystal membranes or microdisk resonators can provide a high-Q cavity for a laser resonator. By enabling high-quality microdisk resonators and photonic crystal membranes in the germanium-based system, one can explore compact resonators for lasers and quantum electrodynamics with a new family of group-IV materials that are compatible with silicon.

Additionally, suspension is useful for MEMS (micro electrical-mechanical systems) technology. By enabling an arbitrary structure in the suspended structure, one can utilize various material properties in compatible systems to engineer resonance properties determined by physical structure/shape, internal strain, and elastic constants.

Specific examples of preferred components for this process in germanium-based materials on silicon with a germanium buffer are:
1) Fluorine-based isotropic selective etch ($CF_4$ in particular) which etches germanium but not germanium-tin. Germanium-tin can be used as the etch-stop layer on a germanium buffer. A germanium "active" structure can be grown on top of the etch-stop layer and is protected from bottom-etching due to the etch-stop layer. Because the structure is the same material as the buffer layer, we can use conformal $SiO_x$ (silicon oxide) or $SiN_x$ (silicon nitride) deposited by plasma-enhanced chemical vapor deposition as a protective layer.
2) Several etch chemistries have anisotropic etching of germanium and germanium-tin. We use $Cl_2$ plasma enhanced by argon ions in an electron cyclotron resonance (ECR) reactive ion etching (RIE) system which etches both germanium and germanium-tin.
3) $CHF_3$ can be used for anisotropic etching of $SiO_x$ or $SiN_x$ protective layers to expose the germanium buffer. This will etch the top protective layer on the structure. We make the top protective effectively thicker by using $SiO_x$ or $SiN_x$ as the mask material during lateral definition with vertical etching. $SiO_x$ and $SiN_x$ are etched slowly with respect to germanium and germanium-tin with $Cl_2$ plasma chemistries. The top protective layer after the conformal protective layer has a thickness of the conformal deposition plus the thickness of the mask layer after lateral definition with vertical etching.

This approach provides significant advantages. Existing methods of forming suspended structures typically require an etch selectivity between the entire structure and the layer it is grown on. For germanium-based materials on silicon, silicon is etched using potassium hydroxide (KOH), which does not etch germanium. However, the inability to arbitrarily place the structure region away from the substrate creates many defects in the structure for lattice-mismatched systems since the structure must begin near the structure-substrate interface. For photonics, this means that the "active" photonic regions will have many defects, which will be extremely detrimental to performance and efficiency of the device.

The method describes here allows the "active" photonic regions in the structure to be defined far away from the interface, allowing for a buffer region in between the structure and the substrate to improve the material quality in lattice-mismatched systems. Such a technology should drastically improve the performance of devices due to the improved material quality in the suspended structure.

The top layer in the structure can either be an etch-stop layer OR can be protected using a pre-deposited layer during micro-/nano-fabrication steps. A preferred method for the latter is to use a hard mask material for lateral pattern definition that is resistant to vertical etching during the lateral pattern definition and the isotropic selective etch. A nitride or oxide material can be used as this hard mask, which is typically resistant to most etch chemistries used to etch semiconductors.

Significant features include:
1) The feature of arbitrary placement and definition of suspended structures by using an etch-stop layer on the bottom surface of the structure and sidewall/top protection.
2) The usage of the former to allow for a defect-reducing buffer layer in lattice-mismatched systems to improve the material quality of the "active" layers in the suspended structures.
3) The freedom to use similar materials (both in elemental content and crystal structure) in the defect-reducing buffer to be sacrificed/undercut and in the suspended structure where etch selectivity only needs to be between the buffer layer material and the etch-stop layer material, assuming the top and sidewall protection layers are sufficiently resistant to most semiconductor etch chemistries.

This approach can solve the issue of poor quality "active" regions in suspended structures on lattice-mismatched substrates by enabling a buffer layer between the structure and the substrate that can be the same material as the structure layer. This will enable improved-quality structures (germanium-based on silicon) that have improved efficiencies for developing devices and products with quality and efficiency necessary for commercialization.

B) Experimental Examples

B1) Introduction

The effort towards developing an efficient group-IV laser has been driven by a motivation to monolithically integrate a full family of photonic devices on a silicon (Si) platform for on-chip optical communications. High-performance active devices, such as photodetectors and optical modulators, have already been developed to help reach this goal; however, the integrated light source has been challenging to develop due to the indirect-bandgap nature of group-IV semiconductors. Recent efforts have utilized germanium (Ge), which is a nearly-direct-bandgap material with its lowest indirect L-valley just 136 meV below the direct Γ-valley in the conduction band (CB). Theoretical and experimental works have shown that the Ge bandstructure can be modified to make direct-gap emission more favorable by using in-plane tensile strain or uniaxial strain, and other efforts to create carrier inversion for lasing can be achieved by donor doping. Recently, the combination of slight strain and high doping yielded the first electrically injected, Ge-based laser using an indirect-bandgap gain medium. However, the high lasing threshold of ~280 kA/cm$^2$ and short operational lifetime limit its practicality. New technologies and designs must be developed to reduce the threshold of Ge-based lasers.

The germanium-tin (GeSn) alloy has the ability to greatly improve the performance of Ge-based lasers by offering a tunable bandstructure. Many theoretical investigations of the alloy bandstructure predict a direct-bandgap material with the substitutional incorporation of Sn in Ge with a crossover point ranging from 2% to 25% Sn. More recently, experimental investigations have determined this crossover point to occur between 6.5% and 11%. This addresses the prominent issue of quantum efficiency for light emission with indirect-bandgap Ge, which has a 4-fold degenerate, indirect L-valley. Any effort towards reducing the energy difference between the direct Γ-valley and the indirect L-valley provides vast improvements in quantum efficiency. Theoretical investigations of Ge-based lasers with Ge or GeSn as the gain medium, either in bulk or in quantum wells (QW) with SiGeSn barriers suggest that reduced laser thresholds can be achieved. These systems, however, require strain-relaxed GeSn, which is difficult to achieve due to the lack of lattice-matched buffer templates. Recent efforts in developing relaxed GeSn films would be useful for realizing such structures. However, these techniques recrystallize amorphous materials or require post-growth thermal annealing, which are likely to result in defects and non-uniformity or Sn precipitation leading to reduced efficiencies for optical emission. High-temperature annealing to reduce defects may have limited benefits in the thermally metastable GeSn alloy with a solid solubility of less than 1% Sn in Ge. It is expected that the highest-quality GeSn material would be grown pseudomorphic (fully strained) to its template or buffer layer with thickness below the critical thickness (40 nm for 8% Sn in Ge on a Ge template) to prevent relaxation from misfit or threading dislocations.

In this section, we demonstrate that pseudomorphic Ge/GeSn/Ge QWs (GeSn-QW) can improve the performance of Ge-based lasers in several ways. In this design, we consider materials and stacks that can be achieved to high quality by combining state-of-the-art GeSn-growth technology with relaxed-Ge growth technology. First, we show how reduced carrier densities for transparency can be realized by using 8% Sn (from this point forward, [x*100]% Sn refers to $Ge_{1-x}Sn_x$) grown pseudomorphic to Ge in GeSn-QW structures. Next, we experimentally explore the pseudomorphic GeSn-QW design on a Si substrate with a thick Ge buffer layer (Ge-on-Si) in between. The GeSn-QW is fabricated into a compact microdisk resonator using a recently developed selective etch of Ge that allows for precise control in defining a single-transverse-mode microdisk away from highly defective regions in the Ge buffer for improved material quality in the active region. The fabrication method presented in this work exemplifies how this etch technology can be used to create other types of Ge(Sn)-based micro/nanophotonic structures. Using micro-photoluminescence (μPL) in a surface-normal pump/collection configuration, we demonstrate for the first time a single-transverse-mode GeSn-based microdisk resonator on Si with greatly enhanced luminescence efficiency in whispering-gallery-mode (WGM) resonances.

B2) Predicted Advantages in Pseudomorphic GeSn on Ge and 20-nm GeSn Quantum Wells Compared to Bulk Ge in Laser Design The motivation behind strain-relaxed GeSn is that strain plays an important role in the bandstructure and affects the quantum efficiency of the alloy. With sufficient amounts of Sn (roughly 7% according to recent experimental results), the alloy becomes direct bandgap. If the alloy is grown on a lattice-mismatched buffer or substrate, the alloy will be under biaxial tensile or biaxial compressive strain, further changing the bandstructure. Additionally, strain splits the light hole (LH) and heavy hole (HH) degeneracy in the valence band (VB). In the case of GeSn grown pseudomorphic on Ge, the alloy is under compressive strain (approximately 0.15% strain per percent Sn added) and will not yield a direct bandgap with technologically interesting Sn contents (less than 15% Sn). While an unstrained or tensile-strained, direct-bandgap GeSn film is desired for high quantum efficiency, pseudomorphic, compressively strained GeSn has several advantages for developing and engineering photonic devices.

The first benefit is that the energy difference between the $\Gamma$ valley and the L valley ($\Delta E_{\Gamma-L}$) decreases as the Sn content increases. Under the conditions studied, GeSn never becomes direct bandgap (defined as $\Delta E_{\Gamma-L} < 0$), but $\Delta E_{\Gamma-L}$ does decrease as the Sn content increases (a 74 meV decrease with 8% Sn). This reduction of $\Delta E_{\Gamma-L}$ is extremely important in obtaining a higher fraction of carriers in the $\Gamma$ valley, reducing the threshold for a GeSn laser. Additionally, the compressive strain applied by the Ge buffer helps to split the HH-LH degeneracy, further reducing threshold carrier densities needed for inversion. The HH is the dominant band for hole population, which favors transverse-electric (TE) gain strongly over transverse-magnetic (TM) gain, greatly improving efficiency in the TE lasing mode.

Another benefit is the possibility of carrier confinement in the GeSn region, which is ideal for developing low-threshold lasers in double-heterostructure or quantum-well designs. With 8% Sn, both the L- and $\Gamma$-valley minima in GeSn should be lower in energy than their corresponding minima in Ge, and a type-I alignment is predicted. Because of the smaller bandgap in GeSn, there will be little CB-to-VB absorption loss in Ge. If integrated into a pseudomorphic GeSn double heterostructure or QW, the Ge regions can act as cladding layers in a waveguide or resonator for lasers while the center GeSn region provides gain to a guided optical mode. Furthermore, the Ge barriers might be useful in isolating the GeSn active region from top and bottom surface states, which can be detrimental to carrier non-radiative lifetimes.

B3) Stack Design and Fabrication of Precisely Defined GeSn Quantum Well Microdisk Resonators Using a Novel Selective Etch and Etch-Stop Layer We explore the advantages predicted in the previous section by considering a GeSn-QW microdisk resonator with 8% Sn and Ge barriers on Si (001). In this design, we wish to have a GeSn gain region between Ge barriers all inside of a micro-disk resonator, a structure that has been shown to display high Q-factors exceeding $10^4$ in other material systems and mimics other extremely high-Q structures. Ideal placement of the GeSn region is in the center of the microdisk where the confined field intensity will be largest for a single-transverse optical mode. To maintain high quality, we keep the GeSn thickness below the aforementioned critical thickness. In addition, a high-quality growth template is desired for epitaxial growth of the GeSn-QW. If the GeSn-QW is grown directly on Si, it is expected that the GeSn gain region will be highly defective, which is detrimental to long non-radiative carrier lifetimes and device performance. To reduce defects in the GeSn active region, a thick and relaxed Ge buffer can be used where multiple hydrogen anneals and continued Ge-epitaxy cycles in the buffer are performed to reduce threading dislocations ($<10^7$ cm$^{-2}$); systematic improvements in the dislocation density are seen even as total Ge thicknesses exceed 2 µm. While high-quality GeSn can be grown on a thick Ge buffer, the formation of a single-transverse-mode microdisk at 2-µm wavelength requires a thickness less than ~250 nm for Ge or GeSn. Current Ge-based microdisk designs rely on a non-Ge substrate or buffer material that can be used as a sacrificial layer to selectively undercut, such as Si or lattice-matched III-V materials. The former is more interesting for integration on Si, but growing a <250-nm thick GeSn-QW directly on Si would result in a highly defective GeSn gain region.

To solve this issue, we leverage a recently developed isotropic dry etch that has extremely high etch selectivity of Ge over GeSn using $CF_4$ chemistry and tuned process conditions. 8% Sn is not etched by this $CF_4$ chemistry, implying that it can be used as an effective etch-stop layer when etching Ge. In addition, this dry etch enables better control of etch rates and etch thicknesses when compared to the alternative wet-etch option, which has around 8:1 selectivity. This technology allows for the growth of a thick, high-quality and relaxed Ge buffer on Si with the GeSn-QW on top.

FIG. 1 shows the material stack used for this work. The GeSn-QW microdisk region 114 is grown on a Si (001) substrate 102 with a thick, relaxed Ge buffer 104 in between. The thickness of the Ge buffer (about 4 µm) allows for multiple hydrogen anneal steps to enable high-quality GeSn/Ge epitaxy on top. The GeSn-QW region 114 is defined by inserting a GeSn etch-stop layer 106 (10 nm, 8% Sn) which allows precise definition of the microdisk region. Within region 114, a GeSn quantum well 110 (20 nm, 8% Sn) is sandwiched between layer 108 (90 nm, Ge) and layer 112 (100 nm, Ge).

The Ge buffer can be etched to form the microdisk post while the entire GeSn-QW is protected. With dimensions and layers of the microdisk defined epitaxially, the GeSn gain region can be precisely placed in the center of the microdisk. A WGM near the edge of the microdisk will experience tight optical confinement due to the strong index contrast of GeSn/Ge and air, and the mode will be centered on the GeSn gain for optimized modal overlap.

Figure 2:
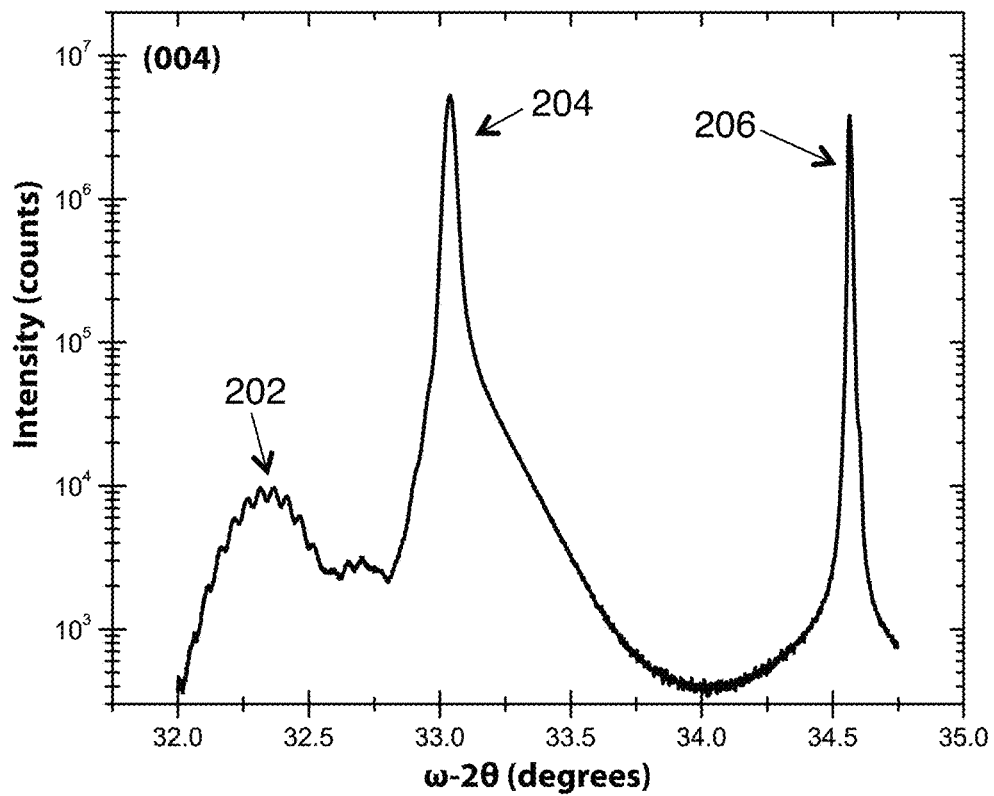
FIG. 2 shows X-ray diffraction results from the sample of FIG. 1.

FIG. 2 shows a 1D ω-2θ X-ray diffraction (XRD) scan around the 004 peak of the material stack of FIG. 1. Diffraction peaks from the GeSn, Ge, and Si layers are referenced as 202, 204 and 206 respectively. The single main GeSn peak is evidence of single-phase growth, and the interference fringes around the GeSn peak indicate extremely abrupt interfaces. The location of the Ge 004 peak indicates a slight tensile strain of 0.16% in the Ge buffer, which is commonly observed for growth of "relaxed" Ge on Si due to the coefficient of thermal expansion difference between Ge and Si.

The material stack in FIG. 1 was grown using an Applied Materials Centura Epi reduced-pressure chemical vapor deposition (RPCVD) system with digermane ($Ge_2H_6$) and tin tetrachloride ($SnCl_4$) precursors at reduced growth temperatures of less than 350° C. for layers above the Ge buffer. All layers in the stack are nominally undoped. The initial 4-µm-thick Ge buffer 104 shown in FIG. 1 provides a smooth, high-quality template for subsequent Ge and GeSn growth using multiple hydrogen-anneal and Ge-growth steps. After growing a thin 10-nm GeSn etch-stop layer 106, we grow the GeSn-QW 114 that forms the entire microdisk region. The 220-nm total thickness of the microdisk region was designed to have a single mode in the transverse direction for 2-µm-wavelength light emission. A 20-nm GeSn layer 110 is located in the center of the microdisk to act as the gain region for this study. The material stack was examined using X-ray diffraction (XRD) for structural analysis. An XRD 1D ω-2θ scan around the (004) reflection was used to determine that the Ge buffer layer is under 0.16% tensile strain (FIG. 2), which is expected for relaxed Ge-on-Si growth. The reciprocal space map around the (224) reflection confirms that the GeSn layer is pseudomorphic to the Ge buffer. Analysis of lattice parameters extracted from XRD results in an 8% Sn layer that is under 1.0% biaxial compressive strain on a slightly tensile-strained Ge buffer. We note that the GeSn etch-stop layer 106 has the same Sn content as the GeSn gain region 110.

FIGS. 3A-H show the fabrication sequence for this work. Briefly, microdisks were fabricated using optical lithography, dry etching, and a silicon nitride ($SiN_x$) sidewall spacer process.

Figure 3A:
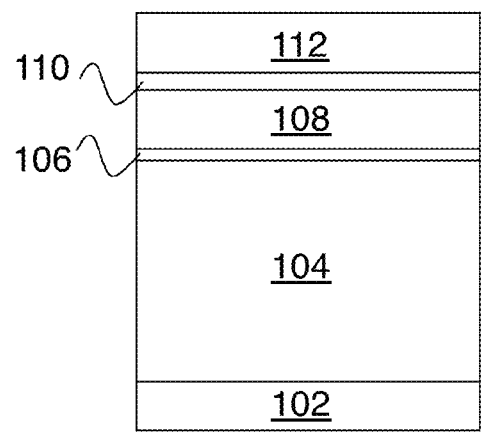
FIGS. 3A-H show an exemplary fabrication sequence for the embodiment of FIG. 3H.
Figure 3B:
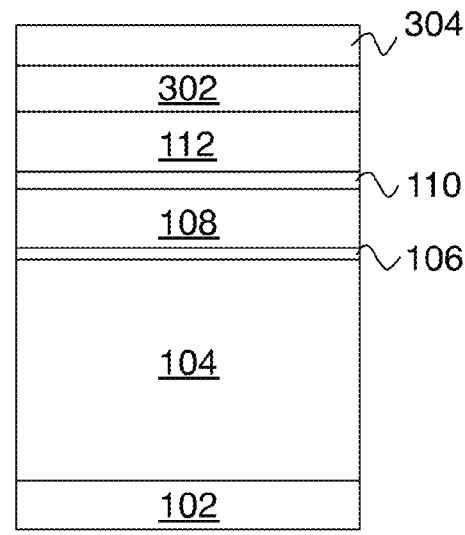
Figure 3C:
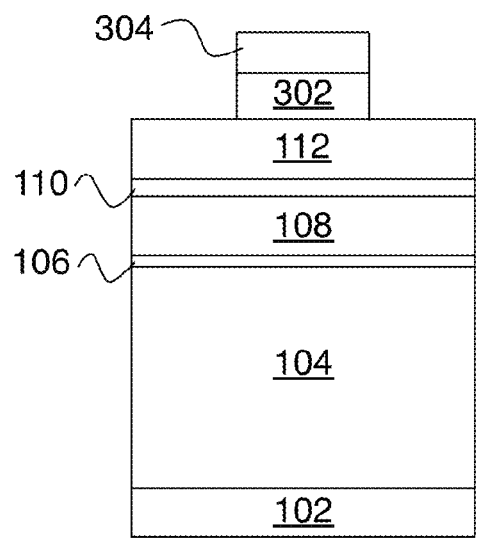
Figure 3D:
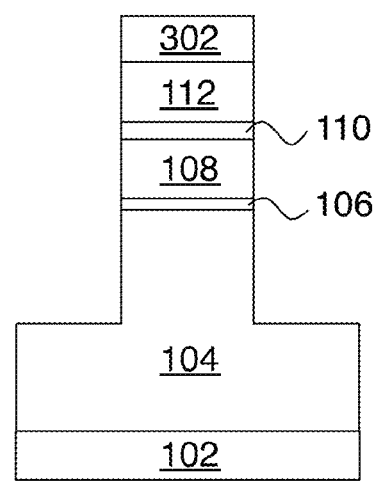
Figure 3E:
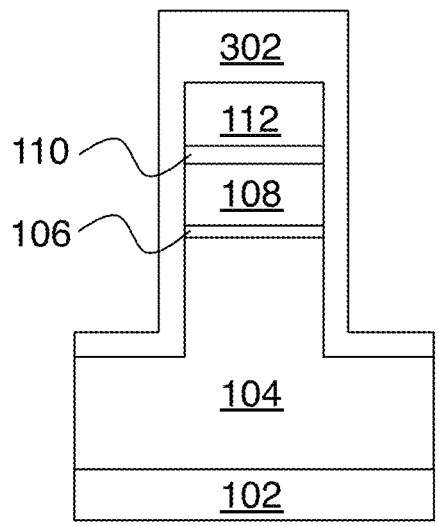
Figure 3F:
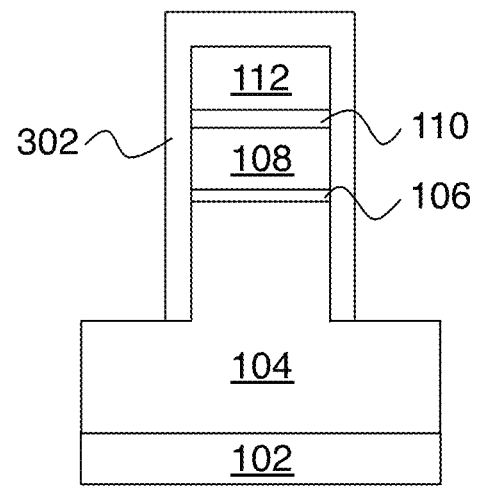
Figure 3G:
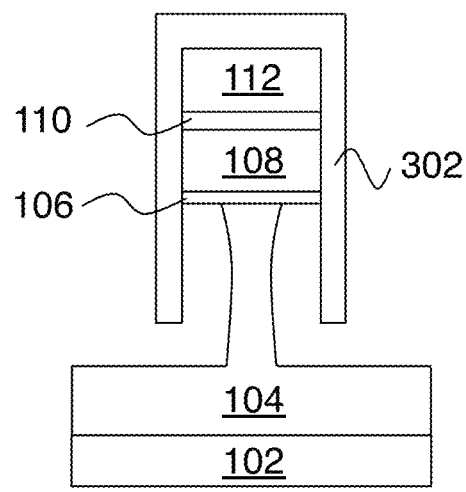
Figure 3H:
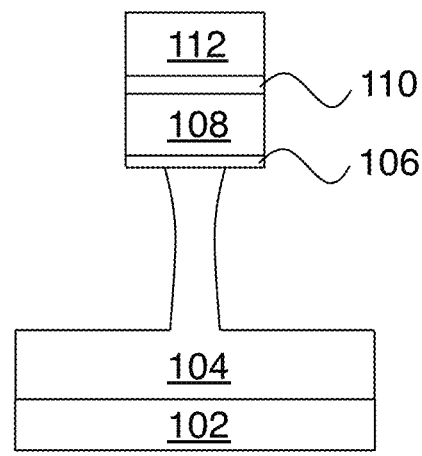

FIG. 3A shows the epitaxial stack of FIG. 1 as the starting point. FIG. 3B shows the result of depositing a 280-nm-thick $SiN_x$ layer 302 using capacitively coupled plasma-enhanced chemical vapor deposition (PECVD) at 350° C. over the entire sample, followed by depositing a 1-μm-thick Shipley 3612 photoresist (PR) layer 304. PR layer 304 was spun at 5500 RPM for 30 s, exposed under UV radiation using an ASML PAS 5500/60 stepper with a microdisk mask, developed for ~30 s using Microposit® MF26A, and "hard" baked at 115° C. for 5 minutes.

The resist pattern was transferred to the $SiN_x$ layer 302 using anisotropic $CHF_3$ dry-etching. The entirety of the $SiN_x$ layer was not etched by dry-etching since $CHF_3$ etches Ge in a sputtering fashion, which may create sidewall roughness and reduce the quality of fabricated microdisks. To finish etching the remaining $SiN_x$, a very short 6:1 Buffered Oxide Etch (BOE) was used, which etches PECVD $SiN_x$. The resulting structure is shown on FIG. 3C.

The patterned $SiN_x$ 302 was used as a hard mask to etch the mesa of the microdisks using $Ar/Cl_2$ electron-cyclotron resonance reactive-ion etching. The etch depth was chosen to etch past the GeSn etch-stop layer 106 and into the Ge buffer layer 104. The resulting structure is shown on FIG. 3D.

A conformal 100-nm-thick $SiN_x$ spacer was then deposited over the entire sample with the original $SiN_x$ hard mask to protect the sidewalls during the undercut etch, which etches all exposed Ge. The resulting structure is shown on FIG. 3E. Here everything is coated by nitride 302.

The thickness of the $SiN_x$ layer was etched off using anisotropic $CHF_3$ dry-etching, exposing the Ge buffer layer while protecting the top and sidewalls of the disk. The resulting structure is shown on FIG. 3F. Here buffer layer 104 is exposed while all other layers are protected by nitride 302.

The isotropic and selective $CF_4$ dry etch (700 mT, 35 W) was used to undercut the Ge buffer 104 while stopping on the bottom GeSn etch-stop layer 106. The etch time was chosen to form microdisks while still keeping a thick support post for heat extraction in subsequent experiments. The resulting structure is shown on FIG. 3G. During this step, Ge regions 108 and 112 in the GeSn-QW are protected by $SiN_x$ 302 (top and sides) and by the 10-nm GeSn etch-stop layer 106 (bottom).

The protective $SiN_x$ layer 302 was removed completely using 6:1 BOE for 7 minutes. The resulting structure is shown on FIG. 3H.

Figure 4:
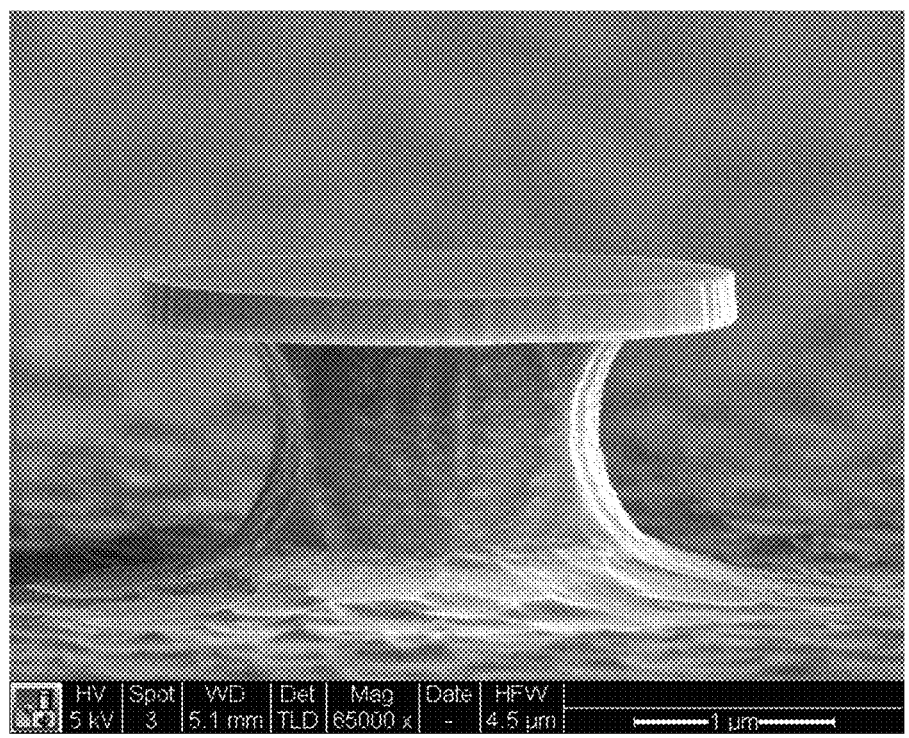
FIG. 4 is a scanning electron microscope (SEM) image of a fabricated suspended structure.

FIG. 4 is a scanning electron micrograph (SEM) image of a completed 2.7-μm GeSn-QW microdisk. The measured thickness of the microdisk is very close to the designed thickness (including the etch-stop layer). As seen in the SEM image, this process yields regions precisely defined by the GeSn etch-stop layer, demonstrating how robust this selective etch and etch-stop combination is in creating micro- and nano-structures in a Ge(Sn) system.

B4) Strong Whispering-Gallery-Mode Resonances from Surface-Normal Micro-Photoluminescence (μPL)

Figure 5:
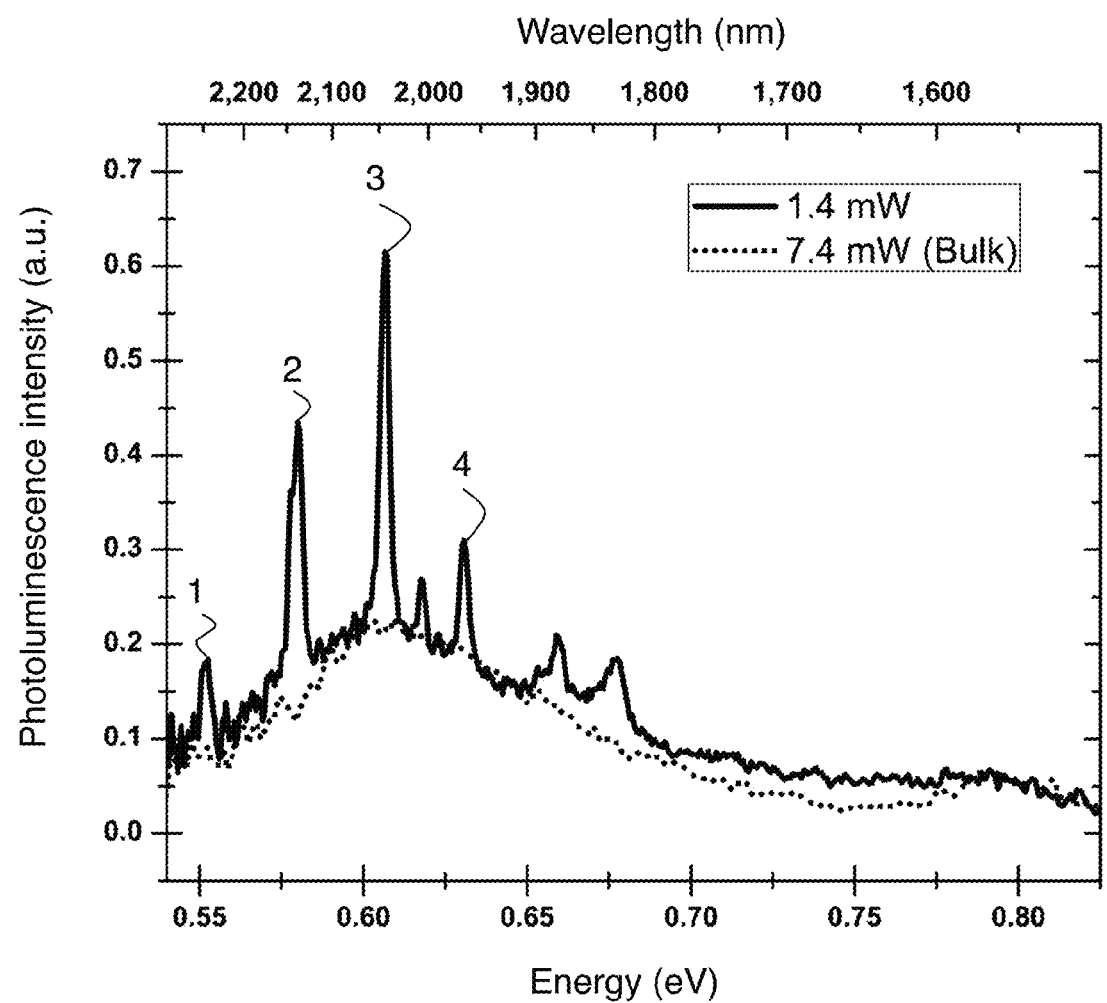
FIG. 5 shows photoluminescence results from a suspended microdisk resonator.

The fabricated GeSn-QW microdisks were probed using μPL with a 980-nm diode laser focused to a ~3-μm diameter spot size in a surface-normal pump/collection geometry. The μPL data for a 2.7-μm GeSn-QW microdisk is shown in FIG. 5. Clear WGM resonances in the low-energy regime (1.4 mW, solid line), which overlap the broadband GeSn emission region as shown in the 7.4-mW-pumped bulk (as-grown) spectrum (dotted line). The broadband PL correlates well with the bandgap predicted using deformation-potential calculations with only slight deviations (less than 50 meV from the lowest bound state of the QW). Under equivalent pump conditions at 1.4 mW, there is strong enhancement of the luminescence from the microdisk when compared to the bulk. The broadband PL is attributed to enhanced surface-normal scattering from the microdisk edges, while the appearance of strong WGM peaks is attributed to stimulated emission. We estimate that in-plane azimuthal mode number (m) is less than or equal to 12 for the resonances seen based on solutions to the Helmholtz equation in the effective refractive index ($n_{eff}$) approximation and assuming the index of GeSn is similar to Ge. The four marked peaks (1, 2, 3, and 4) have an energy spacing of $\Delta_{1,2}=0.0274$ eV, $\Delta_{2,3}=0.0267$ eV, and $\Delta_{3,4}=0.0240$ eV, which we attribute to consecutive-m TE modes. The decrease in energy spacing with increasing energy (or decreasing wavelength) is expected since $n_{eff}$ increases with increasing energy due to both the greater mode confinement and the increasing refractive index at shorter wavelengths. Power-dependent PL spectra (not shown) are characterized by an increase in the broadband and WGM PL signal without any clear signature of lasing or dominance from a single mode.

Additional GeSn gain regions in a multiple QW structure can enable positive net modal gain due to improved overlap with GeSn gain regions. We predict that a modal overlap greater than 1:2 between GeSn:Ge in similar QW structures can enable positive net modal gain using a moderate resonator (loss <150 $cm^{-1}$) under moderate carrier densities (<$4 \times 10^{19}$ $cm^{-3}$) for pseudomorphic 8% Sn. However, this may require a total GeSn thickness greater than the critical thickness to reach the 1:2 ratio and maintain a relatively thick disk for reasonable resonator Q. Other workers have shown that GeSn films with thicknesses far exceeding the theoretical critical thickness can be grown using low-temperature molecular beam epitaxy, and thick, relaxed layers of GeSn/Ge heterostructures have also been developed for other devices; whether the quality of these materials is sufficient for lasers has not been determined. These materials can leverage the same process flow described here to enable strain-relaxed GeSn microdisks with reduced free carrier absorption in the Germanium ($FCA_{Ge}$) through removal of the Ge layer completely. Additionally, it has been shown that strained layers with total thickness beyond the critical thickness in the SiGe/Ge system can be achieved using superlattice or multiple QW layers, where the addition of Ge between strained SiGe layers can reduce the maximum relaxation energy to increase the effective critical thickness. This method could also be applied to the GeSn/Ge system.

In summary, we have shown that pseudomorphic GeSn on Ge has several advantages in improving the performance of Ge-based lasers, and incorporation of 8% Sn in a 20-nm GeSn-QW results in a ~5× reduction in the carrier density needed for net gain. We investigated pseudomorphic GeSn on Ge by designing a GeSn-QW microdisk resonator on a thick Ge buffer for improved material quality. Microdisks were formed using a recently developed selective etch and etch-stop layer, and fabricated devices showed strong WGM resonances and greatly enhanced luminescence in surface-normal PL studies. Lasing in these structures was inhibited by parasitic free carrier absorption in the Ge barriers, and improving the GeSn:Ge ratio with various technologies could overcome this issue. A combination of these technologies with the fabrication process described here to create microphotonic resonators might enable the first GeSn-based laser on Si.

B5) Further Examples

Figure 6A:
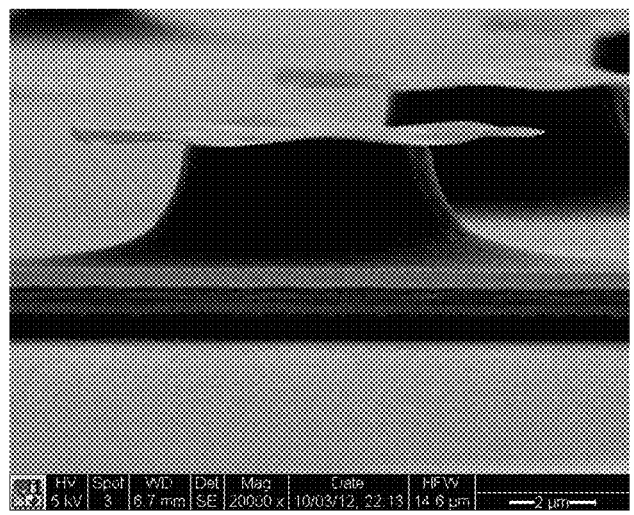
FIGS. 6A-B show SEM images of further exemplary suspended structures fabricated via selective etching.
Figure 6B:
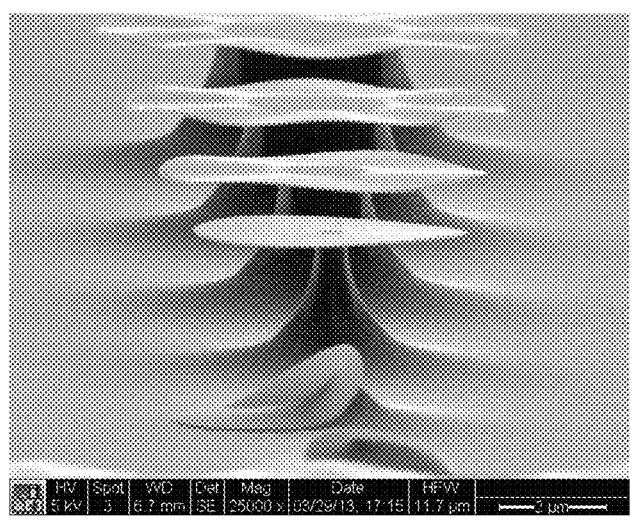

FIGS. 6A-B are SEM micrographs of 30-nm-thick GeSn "potato chips" disposed on Ge posts. The thickness of the GeSn disks matches the design thickness. The undercut due to the Ge etch is around 2600 nm, whereas the thickness of GeSn is mostly unchanged. While prolonged etches were not studied, this demonstrates that GeSn works as an etch stop with $CF_4$. The waviness in the GeSn "potato chips" is due to partial strain relaxation when the straining Ge is removed.

Figure 7A:
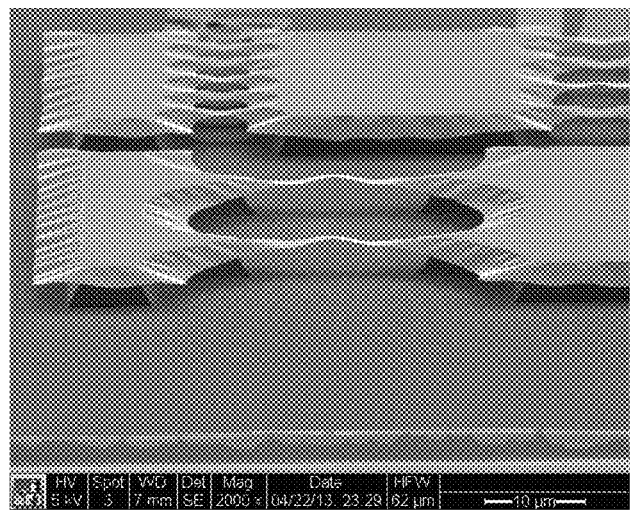
FIG. 7A is an SEM image of a suspended structure having a bridge configuration.
Figure 7B:
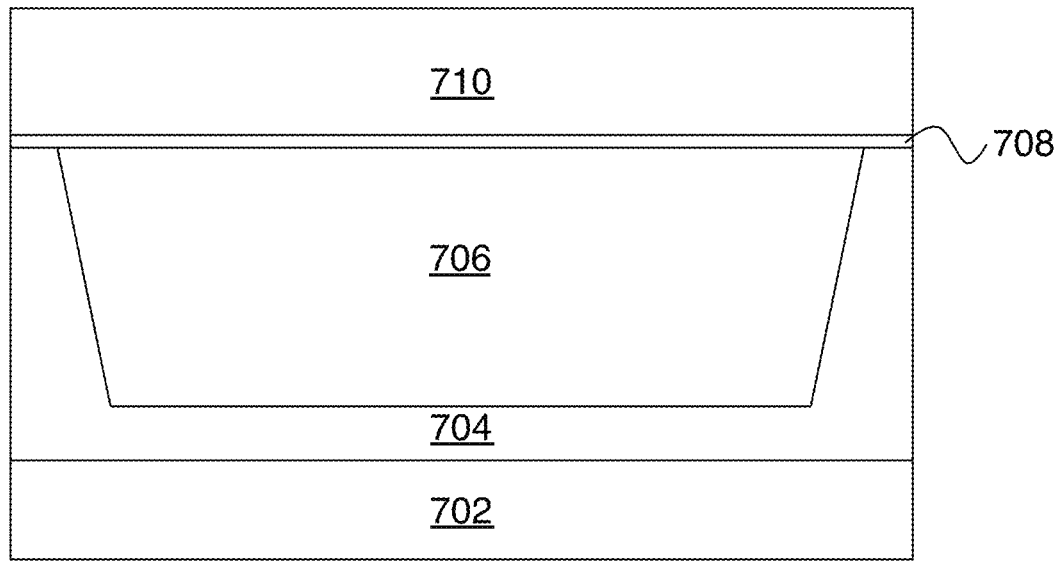
FIG. 7B shows another example of a suspended structure having a bridge configuration.

As indicated above, suspended structures can be configured as bridges. FIG. 7A shows an SEM image of a fabricated example of a 30 nm thick GeSn bridge. Such bridge structures can also be used as a bottom etch stop layer as described above. FIG. 7B shows an example, where region 710 (which can include one or more device layers) is suspended above substrate 702 in a bridge configuration. This bridge is supported by posts of buffer layer 704, and GeSn etch stop layer 708 defines the bottom of the device layers. As indicated above, etch stop layer 708 serves to protect region 710 when buffer layer 704 is etched to provide void 706, thereby forming the bridge structure.

Figure 8A:
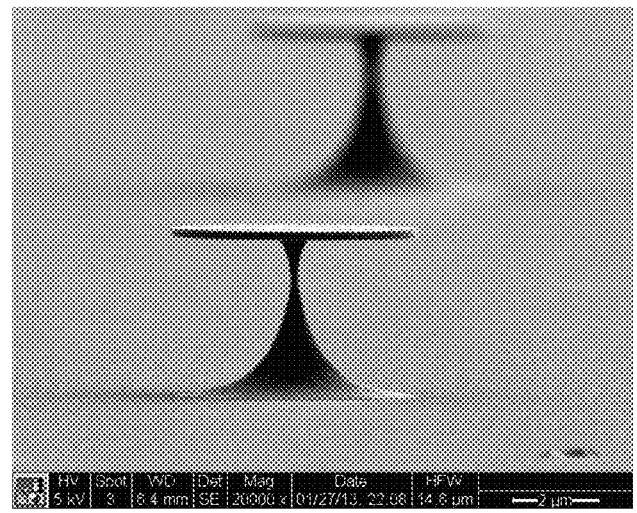
FIGS. 8A-B show SEM images of further microdisk resonators fabricated via selective etching.
Figure 8B:
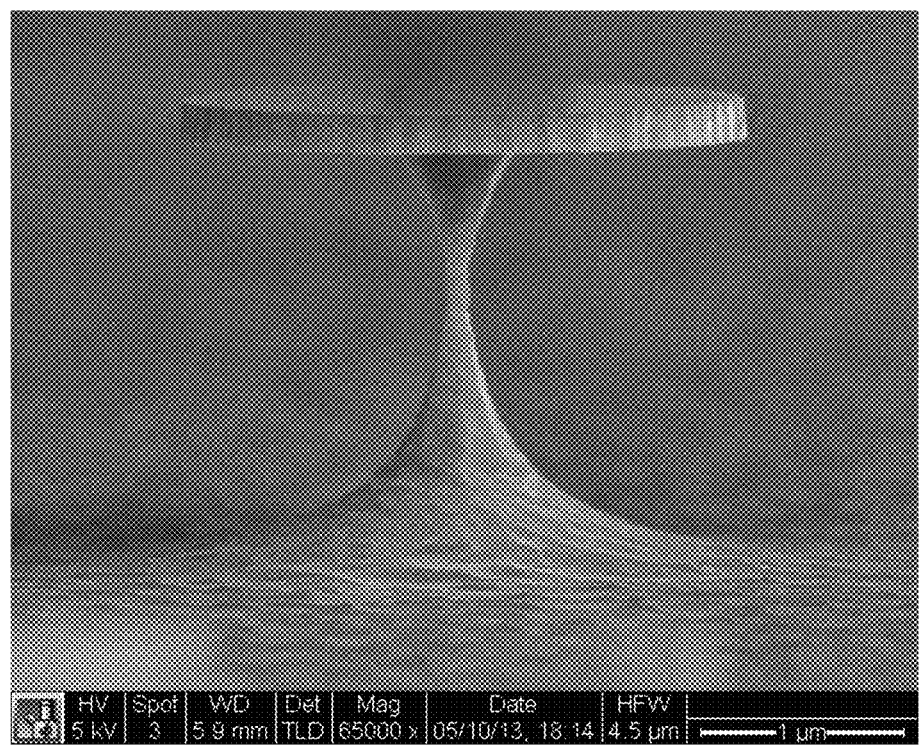

FIGS. 8A-B show SEM images of fabricated microdisk resonators similar to the example of FIG. 4, except that the post diameter is reduced. From these images it is apparent that multiple such structures can be fabricated (FIG. 8A) and that excellent control of the microdisk resonator features is provided (FIG. 8B).

The invention claimed is:

1. A method for selectively etching a semiconductor structure, the method comprising:
    providing a first region having a GeSn composition;
    providing a second region having a Ge composition; and
    selectively etching the second region while not etching the first region by exposing both regions to a fluorine-based isotropic dry etch;
    wherein the fluorine-based isotropic dry etch uses $CF_4$ as an etchant.

2. The method of claim 1, wherein the first region comprises $Ge_{0.92}Sn_{0.08}$.

3. A method of forming a suspended semiconductor structure, the method comprising:
    providing a silicon substrate;
    depositing a Ge buffer for lattice matching on the silicon substrate;
    depositing a GeSn etch stop layer on the buffer;
    depositing one or more device layers having a composition of Ge, SnGe, or SiSnGe on the etch stop layer;
    selectively etching the buffer while not etching the etch stop layer by exposure to a $CF_4$-based isotropic dry etch, whereby the device layers are at least partially suspended.

4. The method of claim 3, further comprising:
    forming features in the one or more device layers; and
    protecting top and side surfaces of the features prior to selectively etching the buffer;
    whereby 3-D protection of the features is provided during the exposure to the $CF_4$-based isotropic dry etch.

* * * * *